United States Patent [19]

Douglass et al.

[11] 4,012,672
[45] Mar. 15, 1977

[54] PLUG-IN MODULE FOR ELECTRONIC DEVICE HAVING COMPONENT FORMING A GUIDE FOR ALIGNING THE MODULE

[75] Inventors: Larry V. Douglass, Coconut Creek; Jerome Leonard, Plantation; Morris L. Minch, Coral Springs, all of Fla.

[73] Assignee: Motorola, Inc., Schaumburg, Ill.

[22] Filed: Mar. 28, 1975

[21] Appl. No.: 563,418

[52] U.S. Cl. ............................. 361/422; 339/14 T; 336/92; 361/392
[51] Int. Cl.² ........................ H05K 5/02; H02B 1/10
[58] Field of Search .... 317/101 R, 101 CB, 101 D, 317/101 CC, 118, 120; 336/90, 92, 136, 192; 174/52 R; 339/14 T, 92 R, 92 M

[56] References Cited

UNITED STATES PATENTS

| | | | |
|---|---|---|---|
| 2,861,249 | 11/1958 | Curtis | 339/14 T |
| 3,181,034 | 4/1965 | Kell, Jr. | 317/101 D |
| 3,278,877 | 10/1966 | Kameya | 336/136 |
| 3,447,036 | 5/1969 | Dore | 317/101 CC |
| 3,546,647 | 12/1970 | Roddy | 336/92 |

*Primary Examiner*—Gerald P. Tolin
*Attorney, Agent, or Firm*—Donald B. Southard; James W. Gillman

[57] ABSTRACT

A plug-in module for an electronic device includes a header having conductors therein which extend therefrom to form terminals, and a substrate connected to the header and supporting electronic components connected to the conductors. One component has a projecting part which extends through the header and forms a guide to align the module with a socket, to facilitate plug-in of the terminals of the header. The module may be a channel element to control the frequency of a radio device and may include a resonant element, such as a piezo-electric crystal, and a coil for tuning a resonant circuit. The form for the coil may be the projecting part for aligning the module, and also provide access to a core therein for tuning the circuit when the module is plugged into the chassis. The module may include a conducting housing which cooperates with the header to form an enclosed structure. A grounding pin may be provided to establish a ground connection for the circuit on the substrate and for the housing. The grounding pin can extend from the header a greater distance than the terminals, and cooperate with the coil form in aligning the module when it is being plugged into a chassis.

10 Claims, 5 Drawing Figures

PLUG-IN MODULE FOR ELECTRONIC DEVICE HAVING COMPONENT FORMING A GUIDE FOR ALIGNING THE MODULE

BACKGROUND OF THE INVENTION

Portable radio transmitter and receiver devices have been provided which are of a size to be held in the hand of a user. These devices have had the circuitry provided compactly on a small printed circuit board which has made servicing and repair difficult. It has been proposed to provide the circuit as plug-in modules, but it has not been possible to provide the required circuitry within the space limits by using known technology. Also, there is a problem of inserting small closely spaced modules and replacing the same as may be required for servicing and repair.

Radio transmitter and receiver devices must operate at prescribed frequencies, and must be held to such frequencies with very small tolerances. This makes it necessary to use frequency controlling elements, such as piezoelectric crystals, and to further provide fine adjustment of the tuning circuits, as by use of an adjustable tuning coil. Prior module construction has not made it possible to provide miniature channel tuning elements within the allotted space, and which can be tuned as required.

SUMMARY OF THE INVENTION

It is an object of the present plug-in invention to provide an improved miniature module for a hand-held radio device.

Another object of the invention is to provide a miniature plug-in module for an electronic device having guiding elements to facilitate plug-in of the module.

A further object of the invention is to provide a plug-in module having a component with a part which extends from the module to form a guide for aligning the module while it is being plugged into a socket.

A still further object of the invention is to provide a channel element for controlling the frequency of an electronic device as a plug-in module having a tuning element accessible when the module is plugged into the device.

In practicing the invention, a miniature plug-in channel element module is provided for controlling the frequency of the transmitter and/or receiver of a hand-held radio device. The module includes a header having conductors extending therethrough, with ends on one side of the header forming plug-in terminals. A substrate having circuit conductors and electronic components mounted thereon is connected to the header to form a frequency controlling circuit. The components may include a piezoelectric element and a tuning coil having an adjustable core for controlling the frequency of the circuit. The coil may include a coil form which extends through the header and forms a guide which cooperates with an opening on the chassis to align the module and facilitate plug-in of the terminals into a socket on the chassis. A conducting pin may also be connected to the header to provide a ground connection to the circuit and to cooperate with the coil form in aligning the module. A conducting housing cooperates with the header to enclose the module. The housing can be formed by a member having four sides which is connected to the header and permits adjustment of the component through the open side. A cover plate can then be seam welded to the member to completely enclose the module. The core can be adjusted by access provided through the coil form when the module is completely enclosed, and after the module is plugged into the chassis.

DETAILED DESCRIPTION OF THE DRAWINGS

Figure 1:
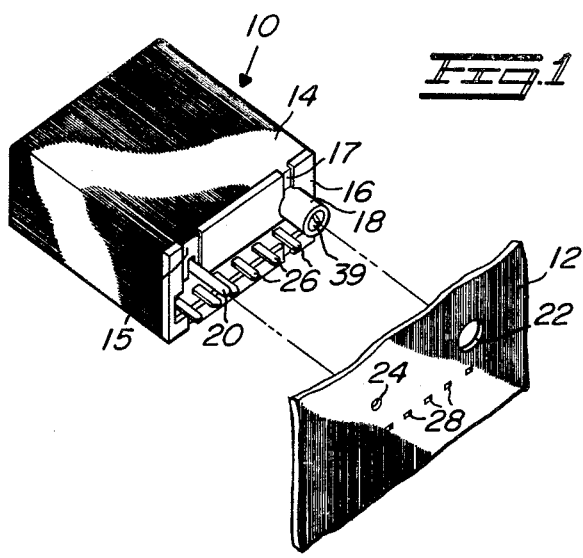
FIG. 1 is a perspective view of the module of the invention and showing the cooperation thereof with a chassis.

In FIG. 1, the module 10 of the invention is shown in position to be inserted in a printed circuit board 12 or other chassis. The module includes a conducting housing 14 and a header 16, which together completely enclose the module. Extending from the header 16 is a tubular member 18, which may be an extension of a coil form of a coil which is used in the module. Also extending from the header 16 is a guide pin 20, which is spaced from the tubular member 18. The chassis 12 has openings 22 and 24 for receiving the member 18 and pin 20, respectively, for aligning the module with respect to the chassis. Also extending from the header 16 are conducting terminals 26 which are adapted to make electrical connections to the circuit of the module 10. The chassis 12 includes sockets 28 which may be of known construction, for making connection to the terminals 26.

Figure 5:
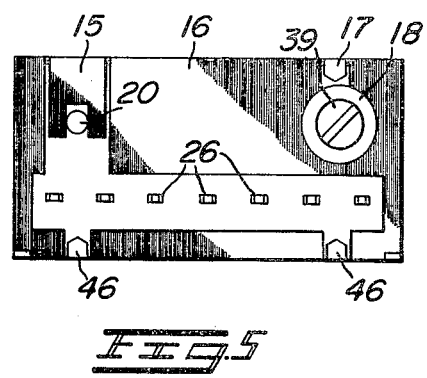
FIG. 5 is a view of the module from the header side.
Figure 2:
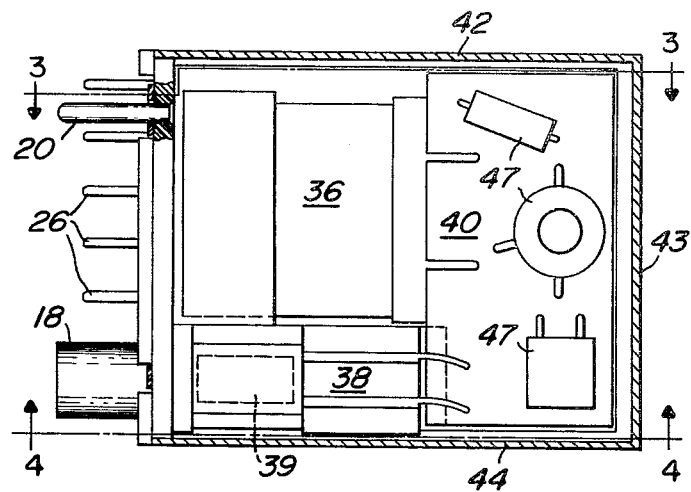
FIG. 2 is a view of the module showing the header and the components on the substrate.
Figure 3:
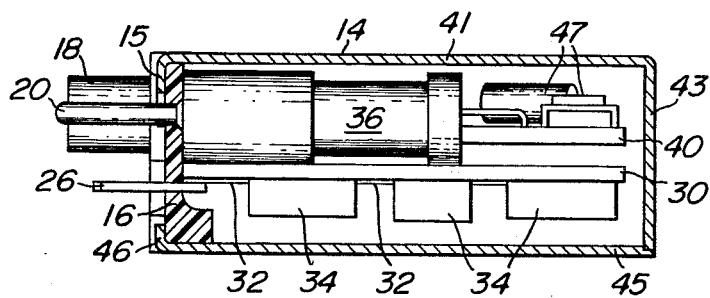
FIG. 3 is a cross-section view along the lines 3—3 of FIG. 2.
Figure 4:
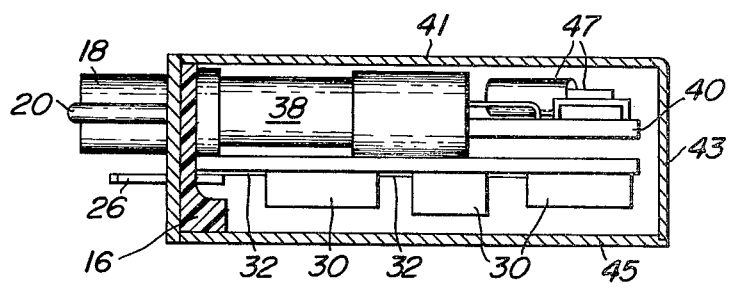
FIG. 4 is a cross-section view along the lines 4—4 of FIG. 2.

As shown in FIGS. 2, 3 and 4, the tubular member 18 and the pin 20 extend from the header a greater distance than the terminals 26, so that the member 18 and pin 20 align the module with the chassis before the terminals 26 engage the sockets 28. This facilitates the plug-in of the terminals, which may be small and relatively easily bent out of position. The pin 20 may be conducting and used to provide a ground connection to the module. As shown in FIGS. 1, 3 and 5, the housing 14 has a tab 15 which extends adjacent pin 20 and can be soldered to the pin to provide a ground connection to the housing 14.

FIGS. 2, 3 and 4 show in a general way the components within the module. A substrate 30, which may be formed of ceramic, extends from the header 16 at right angles thereto, through the center of the module. The substrate 30 may be secured to the header 16 by a suitable cement. Circuit conductors 32 are provided on one side of the substrate 30, to which circuit components 34 are connected. The conductors which form the terminals 26 extend through the header 16 and are connected to the circuit conductors 32. On the opposite side of the substrate 30, a piezoelectric crystal 36 and coil 38 are mounted. The crystal 36 and coil 38 are connected to a small circuit board 40, on which other components 47 are mounted. The coil 38 includes coil form 18 on which a coil is supported, and core 39, which is threaded in the coil form 18 so that it may be adjusted in position therein.

The housing 14 may include a first conducting member which forms four sides 41, 42, 43 and 44 of the enclosure for the module. A fifth side is formed by the conducting plate 45 (FIGS. 3 and 4) which may be seam welded to the sides 42, 43 and 44. The header 16 forms the sixth side of the enclosure. The side 41 has tabs 15 and 17 engaging the header 16, and the side 45 has tabs 46 engaging the header. The side 45 can be left off until the module is tested so that access is provided to the components 30.

As previously stated, the coil form 18 is used as a guide to facilitate the insertion of the plug-in module 10 into a chassis. This is particularly important as the module 10 may be used with other miniature modules in a very small device, such as a hand-held radio transmitter and receiver. The coil form 18 also supports a coil which may be connected in a frequency controlling circuit with the piezoelectric crystal 36, which circuit may be of known construction.

By adjustment of the position of the core 39 within the coil form, the frequency controlling circuit can be tuned to provide the desired frequency. As the core 39 is accessible through the form 18, this tuning can be done after the module is completely enclosed. Also, the circuit can be tuned after the module 10 is plugged into the chassis 12, since the form 18 extends through opening 22 so that the core 39 is still accessible.

The structure of the invention provides a frequency controlling module which is of very small size. For example, the module can have dimensions of the order of 0.9 × 0.7 × 0.3 inches. This module is adopted to be plugged into a socket provided on a chassis, which may be a printed circuit board. Because of the guide structure provided the module can be positioned very close to other modules and can still be easily inserted. The frequency controlling circuit can be tuned after the module is completely constructed and after it is in operating condition on a chassis.

We claim:

1. A plug-in module for an electronic device having a chassis with a socket for receiving the module, including in combination:
   a header having conductors extending therethrough, with portions of said conductors extending from said header and forming plug-in terminals,
   a substrate having electronic components thereon connected to said conductors,
   one of said components having a portion extending through said header and forming a guide to align the module with the socket on the chassis, and
   a housing housing said substrate with electronic components thereon.

2. The structure of claim 1 wherein said one component is a coil, and said portion thereof extending through said header is a coil form.

3. The structure of claim 2 wherein said coil includes a core adjustable within said coil form, with said coil form providing access to said core when the module is positioned on the chassis.

4. The structure of claim 1 further including an elongated member connected to said header and cooperating with said portion of said one component to form guide means to align the module with the socket of the chassis.

5. The structure of claim 4 wherein said elongated member is a conducting pin which forms a ground connection for the module.

6. The structure of claim 5 further including a conducting housing cooperating with said header to form an enclosure for the module, and wherein said housing has a portion connected to said conducting pin to provide a ground connection to said housing.

7. The structure of claim 4 wherein said elongated member and said extending portion of said one component extend from said header a greater distance than said plug-in terminals to align the module and facilitate insertion of the plug-in terminals in the socket of the chassis.

8. The structure of claim 1 wherein said components on said substrate form a frequency controlling circuit for controlling the frequency of an electronic device.

9. The structure of claim 8 wherein said components include a piezoelectric element and an adjustable tuning coil.

10. The structure of claim 9 wherein said tuning coil includes a coil form having a core adjustable therein, with said coil form extending through said header and forming said guide to align the module, and providing access to said core.

* * * * *